United States Patent
Tocci et al.

(10) Patent No.: US 8,612,490 B1
(45) Date of Patent: Dec. 17, 2013

(54) SHARING OF INSTRUCTIONS ACROSS MODEL BOUNDARIES

(75) Inventors: Michael David Tocci, Medway, MA (US); John Edward Ciolfi, Wellesley, MA (US); Pieter J. Mosterman, Framingham, MA (US)

(73) Assignee: The MathWorks, Inc., Natick, MA (US)

( * ) Notice: Subject to any disclaimer, the term of this patent is extended or adjusted under 35 U.S.C. 154(b) by 0 days.

(21) Appl. No.: 13/366,789

(22) Filed: Feb. 6, 2012

Related U.S. Application Data

(63) Continuation of application No. 12/180,067, filed on Jul. 25, 2008, now Pat. No. 8,156,147, and a continuation-in-part of application No. 11/703,336, filed on Feb. 6, 2007, now Pat. No. 7,681,151.

(60) Provisional application No. 61/034,056, filed on Mar. 5, 2008.

(51) Int. Cl.
*G06F 7/00* (2006.01)
*G06F 17/30* (2006.01)

(52) U.S. Cl.
USPC ............ 707/803; 707/804; 716/30; 716/100; 703/3

(58) Field of Classification Search
USPC ............ 707/790, 802, 803, 804; 716/30, 100; 703/3
See application file for complete search history.

(56) References Cited

U.S. PATENT DOCUMENTS

| | | | |
|---|---|---|---|
| 5,845,050 A | 12/1998 | Sekiguchi | |
| 5,974,254 A * | 10/1999 | Hsu | 717/109 |
| 6,223,272 B1 | 4/2001 | Coehlo et al. | |
| 6,343,265 B1 * | 1/2002 | Glebov et al. | 703/25 |
| 6,385,610 B1 | 5/2002 | Deffler et al. | |
| 6,708,143 B1 | 3/2004 | Kurshan | |
| 6,985,905 B2 | 1/2006 | Prompt et al. | |
| 7,043,693 B2 | 5/2006 | Wenzel et al. | |
| 7,703,027 B2 * | 4/2010 | Hsu et al. | 715/763 |
| 7,818,288 B1 | 10/2010 | Dickson et al. | |
| 7,933,755 B1 * | 4/2011 | Warlock | 703/6 |
| 7,984,375 B1 * | 7/2011 | Jaramillo et al. | 715/255 |
| 2003/0016246 A1 | 1/2003 | Singh | |
| 2003/0069908 A1 * | 4/2003 | Anthony et al. | 707/513 |
| 2004/0019872 A1 | 1/2004 | Lippincott et al. | |
| 2004/0034847 A1 * | 2/2004 | Joffrain et al. | 717/113 |

(Continued)

OTHER PUBLICATIONS dSpace News, "More Than Just a Code Generator: TargetLink 2.0." National Instruments, Retrieved from the Internet: www.fengco.se/nl-02-02.pdf, pp. 13-16 (2002).

(Continued)

*Primary Examiner* — Hares Jami
(74) *Attorney, Agent, or Firm* — Nelson Mullins Riley & Scarborough LLP

(57) ABSTRACT

An exemplary embodiment may provide a repository for containing representations that represent a model or a portion of the model. A user may store the representations in the repository, for example, as functions. The functions stored in the repository may be shared and used for processing another model that includes a pattern performing the same or similar function as the representations stored in the repository. A checksum may be compared to determine an equivalent function in the repository. In a different embodiment, the intermediate representation of the pattern may be compared to determine an equivalent function in the repository.

20 Claims, 13 Drawing Sheets

(56) References Cited

U.S. PATENT DOCUMENTS

| | | |
|---|---|---|
| 2004/0107414 A1 | 6/2004 | Bronicki et al. |
| 2006/0136863 A1* | 6/2006 | Szpak .......................... 717/104 |
| 2006/0155520 A1* | 7/2006 | O'Neill et al. ................. 703/11 |
| 2006/0168183 A1* | 7/2006 | Fuller et al. ................... 709/223 |
| 2008/0066053 A1* | 3/2008 | Ramamoorthy et al. ..... 717/114 |

OTHER PUBLICATIONS

National Instruments, "MATRIXx—System design and control development software," Retrieved from the Internet: www.ni.com/pdf/products/us/matrixx_04.pdf <http://www.ni.com/pdf/products/us/matrixx_04.pdf>, pp. 124-127 (2004).

* cited by examiner

SHARING OF INSTRUCTIONS ACROSS MODEL BOUNDARIES

RELATED APPLICATION

This application is continuation of Ser. No. 12/180,067 filed Jul. 25, 2008, entitled: "SHARING OF INSTRUCTIONS ACROSS MODEL BOUNDARIES", which claims the benefit of U.S. Provisional Patent Application No. 61/034,056 filed on Mar. 5, 2008, and is a continuation in part of Ser. No. 11/703,336 filed Feb. 6, 2007, entitled: "SHARING OF INSTRUCTIONS ACROSS MODEL BOUNDARIES." The content of the above applications is incorporated by reference in its entirety.

BACKGROUND

Dynamic systems may be represented by computational models. The models may be textual and/or graphical. The models may contain components, and the components may have associated programming language instructions that represent the functionality of the components. The instructions may include instructions that can be executed on the computing system where the instructions were generated to simulate the behavior of the model. The instructions may also include instructions that can be executed on a target device.

A model developer may wish to work with multiple models. Each model has its own set of programming language instructions for simulating the behavior of the model. Separate instructions sets are generated for the multiple models. As a result, the programming language instructions for the multiple models may require a large amount of memory including the cache and disk space.

Sharing instructions across the model boundaries of multiple models may provide the advantages of, but not be limited to, saving memory space for storing the instructions, saving time for generating instructions, being able to review and test the generated instructions easily and quickly, etc.

SUMMARY

An exemplary embodiment may provide a computer-implemented modeling environment in which a user can reduce memory or other requirements for processing a model in the modeling environment. The term "processing" may be used herein to indicate simulation or generation of software and hardware modules for deployment. The model may be an executable text-based or graphical representation of a system. The executable graphical representation of a system may be, for example, a simulatable graphical representation or a graphical program.

An exemplary embodiment may provide a repository containing instructions that represent a model or a portion of the model. A user may store the instructions in the repository, for example, as functions. The functions stored in the repository may be shared and used for processing another model that includes a pattern performing the same or similar function as the instructions stored in the repository. A checksum may be compared to determine an equivalent function in the repository.

In a different embodiment, an intermediate representation of a model or portion of the model may be stored in the repository and an intermediate representation of another model or portion of the model may be compared to determine an equivalent intermediate representation in the repository. The checksum technology may be used to determine if there is any equivalent intermediate representation in the repository.

According to an embodiment, a computer-implemented method is provided for generating instructions for a model in a modeling environment. The method may identify a portion of a model. The method may search a repository for a function that matches the portion of the model. The model may be processed to produce instructions for the model by including instructions for the function stored in the repository in the produced instructions.

Another embodiment provides a computer-readable medium for holding instructions that are executable in a computing device. The medium may include instructions for identifying a portion of a model. The medium may also include instructions for searching a repository for a function that matches the portion of the model. The medium may include instructions for processing the model to produce instructions for the model by including instructions for the function stored in the repository in the produced instructions.

According to an embodiment, a system is provided for generating instructions for a model in a modeling environment. The system may include a repository for storing functions. The system may also include a processor for identifying a portion of a model, for searching a repository for a function that matches the portion of the model, and for processing the model to produce instructions for the model by including instructions for the function stored in the repository.

BRIEF DESCRIPTION OF THE DRAWINGS

The invention will be apparent from the description herein and the accompanying drawings, in which like reference characters refer to the same parts throughout the different views.

DETAILED DESCRIPTION

Figure 1:
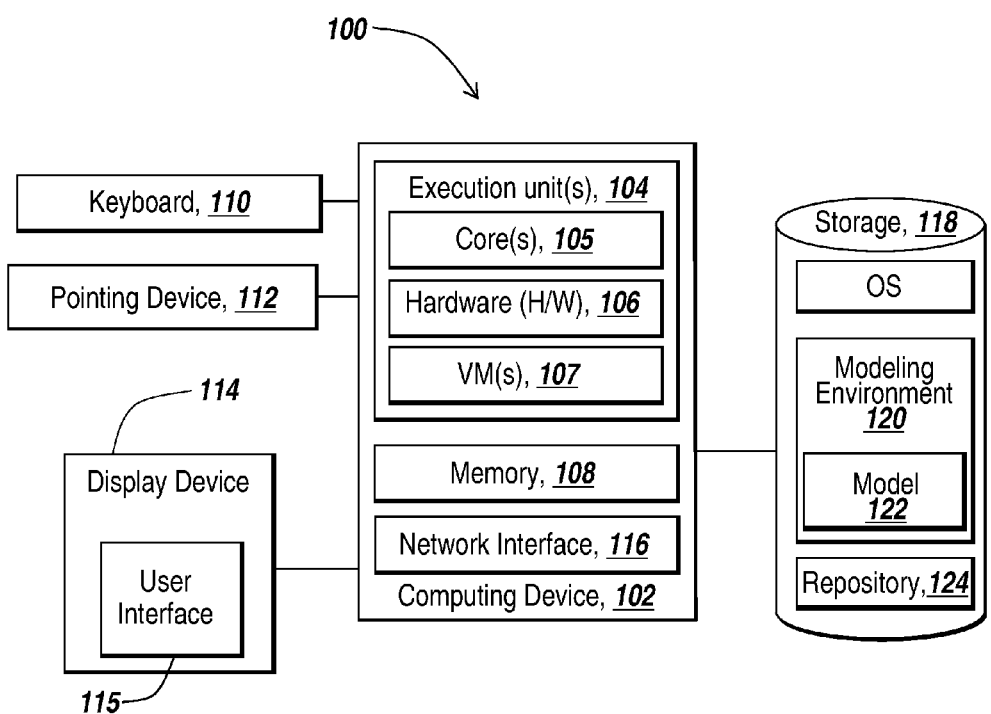
FIG. 1 depicts an exemplary computing device for practicing an exemplary embodiment.

A model represents a system. Models may embody behaviors. Such models are referred to as "dynamic models." A dynamic model may be executed to determine the behavior of the model. A model that is capable of being executed independently or outside of other models is called a stand-alone executable model. A stand-alone executable model may be an independent entity that contains all the data necessary for execution of the model. The stand-alone executable model may include configuration information, such as the information regarding what solver is used to execute the model, what start time and what stop time hold for an execution, whether to execute in a normal or debug mode, whether to gather profiling or coverage information, whether to execute in an interpretive or compiled mode, which optimizations should be employed (e.g., signal storage reuse), etc. The stand-alone executable model may also include context information regarding the circumstances where the model is executed. For example, the stand-alone executable model may include information regarding whether a model is executed in a fixed-point data type environment or in a floating-point data type environment. Implementation information may also be included in the stand-alone executable model. The term "stand-alone executable model" may refer to all of the data necessary for executing the stand-alone executable model.

A stand-alone executable model may be an encapsulated element that does not adapt to the context in which it is used. The encapsulation prevents, for example, data types, input dimensions, complexity (imaginary or real), and functionality, of the model from being changed depending on its context.

A stand-alone executable model may be compiled and represented in a stand-alone executable data structure. The executable data structure may include instructions that allow a solver to generate the dynamic behavior of the model. The stand-alone executable model may include one or more simulation loops for evaluating the methods or equations that correspond to the components of the model. The simulation loops may employ a standalone executable data structure. A standalone executable model may contain the information to create a standalone executable data structure. The standalone executable data structure may contain the data necessary to generate behavior over an interval of time. The standalone executable data structure may be set up to, for example, allocate all necessary storage, execute initialization functionality, compute values of variables, change the state of the dynamics, repeat the above functionalities as long as desired, and then execute termination functionality. All the functionalities may be performed automatically. The one or more simulation loops may be iterated to trace the outputs of the components of the model. During the iteration of the simulation loops, the equations or methods corresponding to the individual component of the model are executed to determine the behavior of the model.

A model may be executed using multiple simulation loops that are independent of each other. The independent simulation loops may not reference other simulation loops. The multiple simulation loops may be executed in series or in parallel using multiple threads, tasks, processes, etc., to determine the behavior of the model. The use of multiple simulation loops may enhance the execution efficiency of the model.

A behavior may be determined by the output, state, or structure of a system. A behavior of the system may be represented in a model as a sequence of values (numerical values, symbols, etc.) and/or structures. This behavior may evolve or progress, for example, with respect to an independent variable, such as time.

A behavior may evolve or progress in a continuous or discrete time domain. In the case of computational systems, the domain may represent logical or physical time. In time-based systems, for example, a behavior may be represented by differential and difference equations. Algebraic equations may complement the differential and difference equations by capturing instantaneous relationship. In untimed systems, a behavior can be represented by transitions that may result in a sequence of values.

To determine a behavior, computation may be employed. Such computation can be performed by instructions in software or hardware constructs, also referred to as "hardware instructions." A model may be processed in one or more stages to arrive at a representation that includes software and/or hardware instructions to determine a behavior. The result of the processing in an intermediate stage may be referred to as "an intermediate representation." Each of the intermediate representations as well as the instructions may be used to determine the behavior. To determine behavior, the intermediate representations may require a computational infrastructure such as, for example, a simulation engine.

To determine a behavior based on the instructions, the instructions can be executed on the platform of the system that is modeled. Such platform may be a general purpose personal computer, a field programmable gate array, a dedicated digital signal processor, application specific hardware, etc. The model may also be simulated on a platform other than the platform of the system that is modeled. Simulation may employ general purpose data structures that are used to capture the model specific data structures. Similarly, simulation may employ a general purpose execution structure that is used to capture the model specific execution. Varying levels of execution structures may be employed, from general purpose structures to dedicated data structures. Parts of the representation of a model may be at an instruction level and dedicated while other parts may be in the form of a general purpose representation.

Exemplary embodiments may share programming language instructions (hereinafter "instructions") across model boundaries in a modeling environment. Instructions for execution of common components (e.g. blocks, sets of blocks, functions, etc.) found in the models may be shared. Moreover, instructions generated from common components in the models may include instructions for execution of the common component in the system under design or instructions or instructions for execution of the common component in a model of the system under design. In particular, the generated instructions may be shared or the instructions that generate the instructions for the components on the target may be shared. This sharing of instructions may result in a significant benefit of, but not limited to, savings in the amount of memory and time required to execute the models or to generate instructions, being able to review and test the generated code or instructions easily and fast, etc.

A system can be executed to generate a behavior. If the system is a model of another system, the system that is a model is called the model and the system that it models is called the system. The execution of a model simulates the execution of the system. Simulation is the execution of the model. This execution can be done on a data structure that requires an interpretation by a simulation engine. The data structure matches the control structure in the simulation engine which may be implemented by message passing. Alternatively, the execution can be done on a data structure that has part or all of the required control built-in. This allows accelerated execution, e.g., because of less message passing overhead. If the control is built in, the data structure may be compiled into a shared library. For example, code may be generated that can be compiled into a binary representation.

In exemplary embodiments, instructions may refer to computer-executable data or statements in any hardware description language (HDL) such as Verilog or Register Transfer Level (RTL), or any computer language, such as machine language, assembly language or high-level language. For example, instructions for a component of a model may include computer-executable data or statements for performing the function of the component.

Exemplary embodiments may provide a repository for storing the shared instructions. The instructions in the repository may be shared and reused for processing different models that include a pattern of components equivalent to the instructions stored in the repository. The reuse of instructions for an equivalent pattern of components in a model can reduce memory requirement for the model, and produce more efficient data management. The sharing of instructions across model boundaries may reduce the memory footprint and processing time for the models when executing instructions for multiple models.

In an exemplary embodiment, a model may include several components that are also models (sub-models). A first component or sub-model may be analyzed separately and instructions for the first component may be saved in a repository. A second component or sub-model may be analyzed and checked for possible equivalence with the first component in the repository. When the second component is equivalent with the first component, instructions for the second component may be generated from the repository. Instructions for the top most model may be generated, and linked with the instructions for the second component.

A model may be a graphical representation of a system. An exemplary graphical representation of a system may be a block diagram model or other type of graphical model. The term "block diagram" is used for representing graphical models or programs of computation where blocks may define operations, represent mathematical equations, or contain state information, and lines or signals may be used to carry information, describe dependencies, or define relationships between the blocks. The terms "block" and "blocks" do not refer exclusively to elemental dynamic systems, but may also include other modeling elements that aid in readability and modularity of block diagrams. For instance, data flow block diagrams are block diagrams that describe a graphical programming paradigm where the availability of data (often thought of as tokens) is used to initiate the execution of blocks, where a block represents an operation and a line represents execution dependency as data flowing between blocks.

The term "model" may be used to refer to an entire system or a portion of the system, such as a subsystem, etc. A model may include sub-models as the components of the model. A portion of a model may include a pattern of the components, which may be described by the components and the connections between the components.

FIG. 1 depicts exemplary computing device 100 suitable for practicing an embodiment. Computing device 102 may include execution unit 104, memory 108, keyboard 110, pointing device 112, network interface 116 and storage 118. Execution unit 104 may include hardware or software based logic to execute instructions on behalf of computing device 102. For example, in one implementation execution units 104 may include one or more processors, such as a microprocessor. In one implementation, execution unit 104 may include single or multiple cores 105 for executing software stored in memory 108, or other programs for controlling computing device 102. In another implementation, execution unit 104 may include hardware 106, such as a digital signal processor (DSP), a graphics processing unit (GPU), a field programmable gate array (FPGA), an application specific integrated circuit (ASIC), etc., on which at least a part of applications can be executed. In another implementation, execution units 104 may include virtual machine (VM) 107 for executing the instructions loaded in the memory 108. Multiple VMs 107 may be resident on a single execution unit 104.

Memory 108 may include a computer system memory or random access memory (RAM), such as dynamic RAM (DRAM), static RAM (SRAM), extended data out RAM (EDO RAM), etc. Memory 108 may include other types of memory as well, or combinations thereof. Computing device 102 may include input devices, such as keyboard 110 and pointing device 112 (for example, a mouse) for receiving input from a user. A display device 114, such as a computer monitor, may be provided. Optionally, keyboard 110 and pointing device 112 may be connected to display device 114, or a soft keyboard may be implemented by a touchscreen input device. A graphical user interface (GUI) 115 may be shown on the display device 114. Computing device 102 may include other suitable conventional I/O peripherals. Moreover, computing device 102 may be any computer system such as a workstation, desktop computer, server, laptop, handheld computer, smartphone, or other form of computing or telecommunications device that is capable of communication and that has access to sufficient processor power and memory capacity to perform the operations described herein.

Additionally, computing device 102 may include network interface 116 to interface to a Local Area Network (LAN), Wide Area Network (WAN) or the Internet through a variety of connections including, but not limited to, standard telephone lines, LAN or WAN links (e.g., T1, T3, 56 kb, X.25), broadband connections (e.g., integrated services digital network (ISDN), Frame Relay, asynchronous transfer mode (ATM), wireless connections (e.g., 802.11), high-speed interconnects (e.g., InfiniBand, gigabit Ethernet, Myrinet) or some combination of any or all of the above. Network interface 116 may include a built-in network adapter, network interface card, personal computer memory card international association (PCMCIA) network card, card bus network adapter, wireless network adapter, universal serial bus (USB) network adapter, modem or any other device suitable for interfacing computing device 102 to any type of network capable of communication and performing the operations described herein.

The storage device 118 may be, for example, a hard-drive, CD-ROM or DVD, for storing an operating system (OS) and for storing application software programs, such as modeling application or environment 120. Modeling environment 120 may run on any operating system such as any of the versions of the Microsoft® Windows operating systems, the different releases of the Unix and Linux operating systems, any version of the MacOS® operating system for Macintosh computers, any embedded operating system, any real-time operating system, any open source operating system, any proprietary operating system, any operating systems for mobile computing devices, or any other operating system capable of running on the computing device and performing the operations described herein. Furthermore, the operating system and modeling environment 120 can be run from a bootable CD, such as, for example, KNOPPIX®, a bootable CD for GNU/Linux.

Modeling environment 120 may enable a user to build and execute a model 122 of a system. In modeling environment 120, instructions may be generated for the model 122, such as source code, intermediate representations, etc., for example for simulation using the model or to execute the model on a target device. The user may also generate instructions that generate instructions for the model 122 on the target device.

The generated instructions may be stored in repository 124. Modeling environment 120 may enable processing the model 122 using the instructions previously stored in repository 124.

Modeling application or environment 120 may include a text-based modeling environment. An exemplary text-based environment may be available in the MATLAB® environment, from The MathWorks, Inc., LabVIEW® or MATRIXx from National Instruments, Inc., Mathematica® from Wolfram Research, Inc., Mathcad of Mathsoft Engineering & Education Inc., Maple™ from Maplesoft, a division of Waterloo Maple Inc., Comsol from Comsol AB of Sweden, Scilab™ from The French National Institution for Research in Computer Science and Control (INRIA), Le Chesnay Cedex, France, GNU Octave, C++, JAVA, etc.

Modeling environment 120 may include a graphical environment. An exemplary graphical environment may be available in the Simulink® environment, the SimEvents® environment, the Stateflow® environment, the SimMechanics™ environment, all from The MathWorks, Inc., LabVIEW® or MATRIXx from National Instruments, Inc., SoftWIRE by Measurement Computing, VisSim by Visual Solutions, WiT by DALSA Coreco, VEE Pro by Agilent, Dymola from Dynasim AB, Extend from Imagine That, Inc., Scicos from The French National Institution for Research in Computer Science and Control (INRIA), MSC.Adams® from MSC-.Software Corporation, Rhapsody® and Rational® from International Business Machines Corporation, ARTiSAN Studio from ARTiSAN Software Tools, Inc., SCADE™ from Esterel Technologies, Inc., etc.

Figure 2:
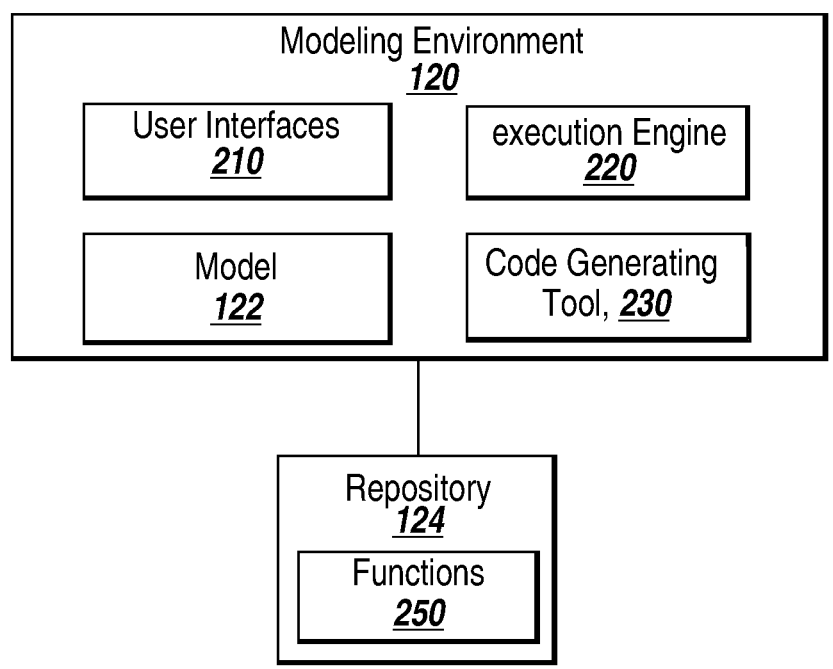
FIG. 2 depicts an exemplary modeling environment and an exemplary repository provided in an exemplary embodiment.

FIG. 2 depicts more detail regarding the modeling environment 120 and the repository 124. The modeling environment 120 may include user interfaces 210, execution engine 220, and code generating tool 230, which will be described in greater detail below. Modeling environment 120 may allow a user to build model 122 of a system using user interfaces 210. The model 122 may include, for example, blocks and lines. The blocks may define operations, and the lines may define relationships between the blocks.

Execution engine 220 may compile and link the model 122 to generate an executable form of instructions for carrying out execution of the model. The model 122 may be executed to simulate the system represented by the model 122. The simulation of the model 122 may determine the behavior of the system represented by the model 122.

Execution engine 220 may convert the model into the executable form of instructions using a directed graph. Execution engine 220 may carry out the task of compiling and linking the model to produce an "in-memory executable" version of the model that is used for generating code and/or executing a model. The in-memory representation of the model may be executed to determine the behavior of the model. The compile stage may involve checking the integrity and validity of the component interconnections in the model. In this stage, the engine 220 may also sort the components in the model into hierarchical lists that are used when creating the component method execution lists. In the link stage, the execution engine may use the result of the compiled stage to allocate memory needed for the execution of the various components of the model. The linking stage may also produce component method execution lists that are used by the execution of the model. The block method execution lists are generated because the simulation of a model may execute component methods by type (not by component) when they have a sample hit. Execution engine 220 may repetitively execute the instructions e.g., via successive time steps from an execution start time to a stop time specified by the user or until the execution is interrupted.

Execution engine 220 may enable interpretive execution of part or all of the model Likewise, execution engine 220 may enable compiled or accelerated execution of part or all of the model. Combinations of interpretive and compiled or accelerated execution may also be enabled by execution engine 220.

Code generating tool 230 may be used to generate instructions from part or all of a model. The generated instructions may include source code, object code, a compiled executable or library for forming an executable. Code generating tool 230 may also be used to generate a hardware description language representation from part or all of model 122. Code generating tool 230 may use implementations of instructions for portions of model 122 to generate executable code, instructions, etc. in a programming language such as Java, Javascript, C or C++ or a hardware description language such as Verilog or VHDL. To generate instructions, code generating tool 230 may convert a source language representation to a target language. Code generating tool 230 may comprise an extended version of a code building tool such as Real-Time Workshop® from The MathWorks, Inc. of Natick, Mass. or any portion thereof, or may be substantially any software component for generating executable code, instructions, etc., in a programming language such as Java or C or in a hardware description language such as Verilog or VHDL. If instructions for a model are generated by code generating tool 230, then the generated instructions may be compiled and linked to execute. In some cases, the user may deploy the instructions to a target device for execution.

In an exemplary embodiment, modeling environment 120 may be coupled to repository 124 so that modeling environment 120 can communicate with repository 124. A user may generate instructions for model 122 and store the instructions in the repository 124. The instructions may be stored in repository 124, for example, as functions 250 in software. The instructions may be stored in repository 124 in different form, such as processes that can be implemented in hardware. The instructions stored in the repository 124 can be shared in processing other models to reduce memory or other requirements for processing other models.

The repository 124 may refer to a collection of information stored in memory or storage. In an exemplary embodiment, the repository 124 may be, for example, a database with the code for functions and the checksums for each function.

Figure 3A:
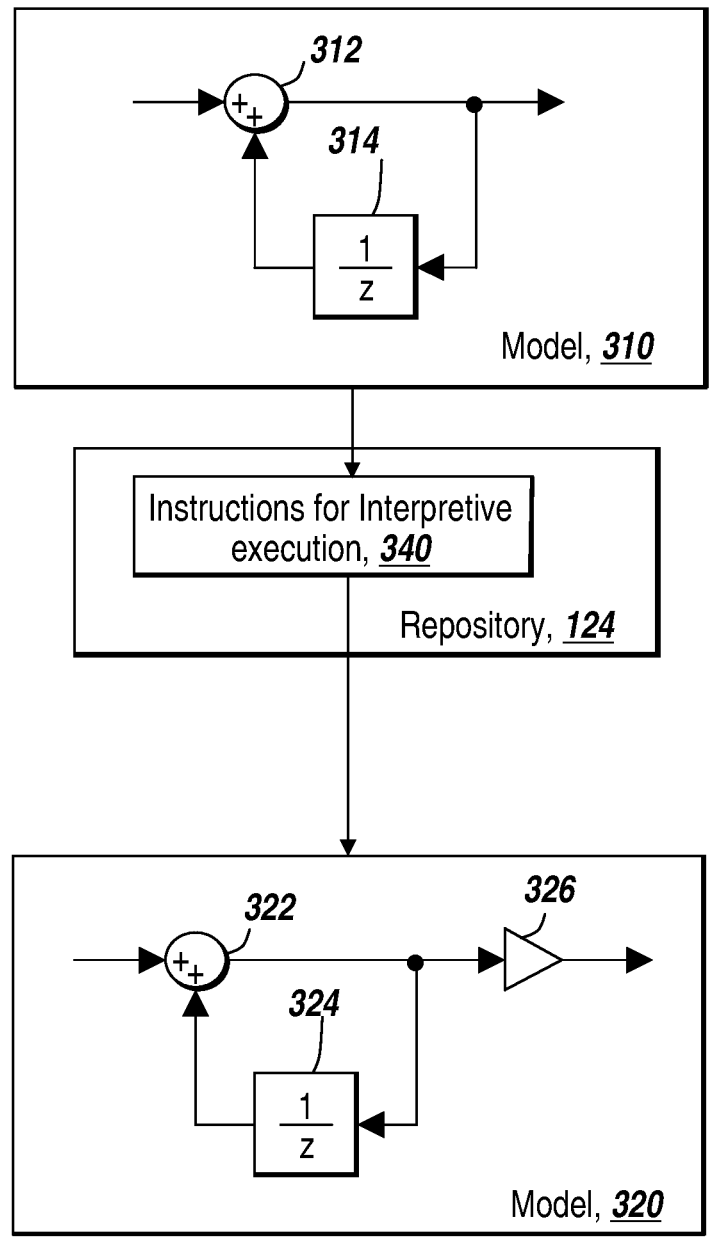
FIGS. 3A-3C depicts exemplary models that share instructions.

FIG. 3A depicts exemplary models that share instructions for executing the models. The first model 310 may include a pattern of components, such as sum block 312 and delay block 314. Instructions 340 may be generated for executing the first model 310 or a portion of the model 310. Instructions 340 may be generated in response to a user's request or automatically based on a user's interaction. The generated instructions 340 may be stored in the repository 124 for sharing the instructions 340 with other models, such as the second model 320. The generated instructions 340 may be stored as a function.

The second model 320 may include the same or a similar pattern of components (e.g., sum block 322 and delay block 324) as the first model 310. The second model 320 may include additional components, such as gain block 326. When generating instructions for executing the second model 320, the generated instructions may include a function call to the instructions 340 stored in the repository 124. When executing the second model 320, the instructions 340 may be shared with the second model 320 by calling the function. The second model 320 may be executed without generating instructions for the same or similar pattern of components as the instructions. As a result, a single set of instructions 340 may be shared across the boundaries of the first model 310 and the second model 320.

Figure 3B:
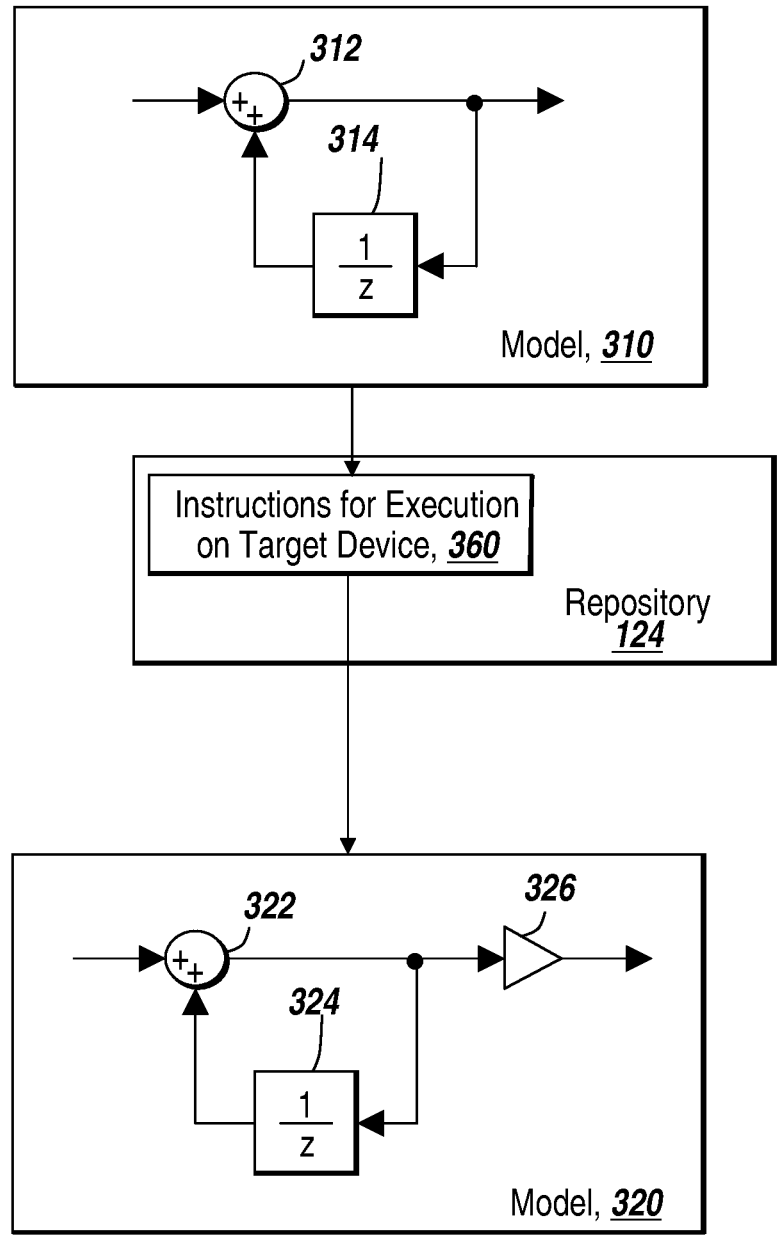

FIG. 3B depicts an exemplary embodiment in which the first and second models 310 and 320 share instructions for executing the models on a target device. A user may generate instructions 360 for executing the first model 310 or a portion of the model 310 on a target device. The user may store the generated instructions 360 in the repository 124 for sharing the instructions 360 with other models, such as the second model 320. The generated instructions 360 may be stored, for instance, as a function.

The user may generate instructions for executing the second model 320 on the target device. The generated instructions may include a function call to the instructions 360 stored in the repository 124. When executing the second model 320 on the target device, the instructions 360 may be shared with the second model 320 that calls the function. The second model 320 may be executed on the target device without generating instructions for the same or similar pattern of components as the instructions 360. As a result, a single set of instructions 360 may be shared across the boundaries of the first model 310 and the second model 320.

Figure 3C:
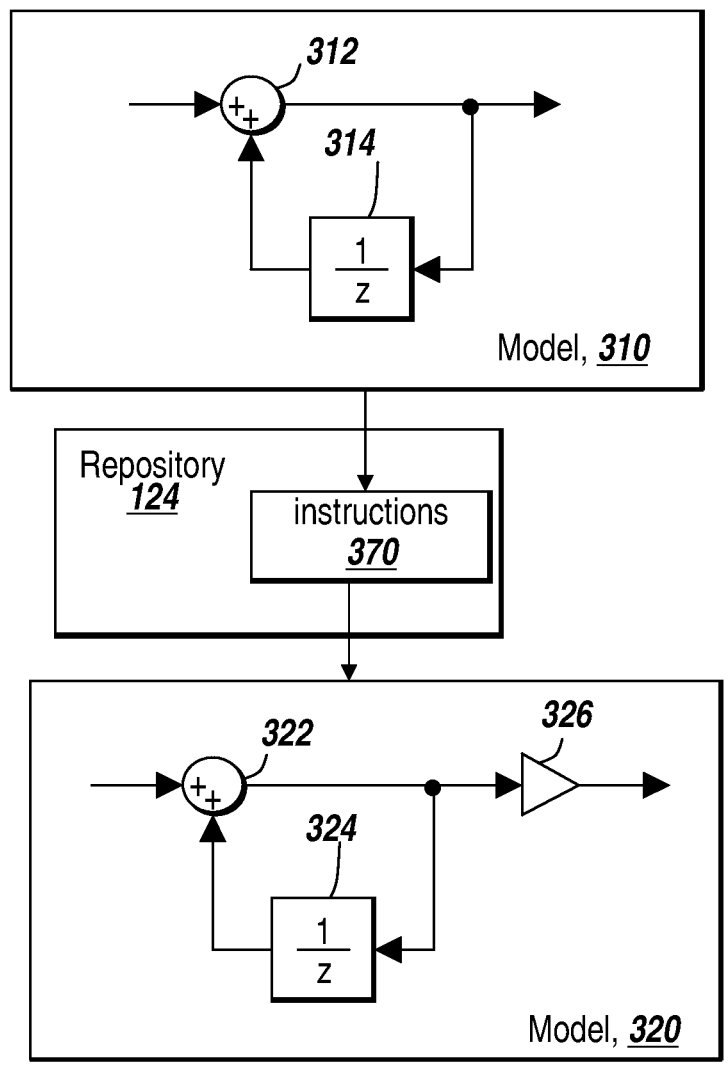

FIG. 3C depicts an exemplary embodiment in which the first and second models 310 and 320 share other types of instructions. For example, the first model 310 and the second model 320 may share instructions 370 that generate or be used to generate instructions 340 for executing the first model 310 and the second model 320, or instructions 360 for executing the first model 310 and the second model 320 on a target device. The instructions 370 may be the source code of the first model 310 and the second model 320. In another embodiment, the instructions 370 may be the intermediate representation (IR) of the models, such as a control flow graph or a data flow graph or a combination of the two, or any other representation that captures the functionality of the stored instructions. The intermediate representation may be employed for analyses such as proving assumptions, generating tests, generating one or more linearized representations, computing an abstract semantic representation, etc.

Figure 4:
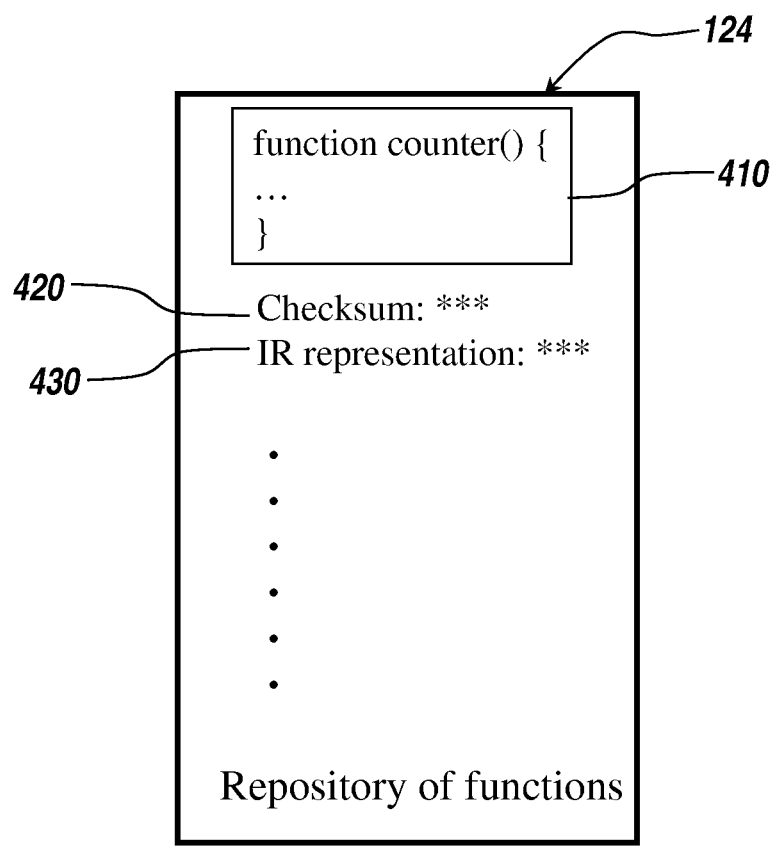
FIG. 4 depicts an exemplary repository that stores instructions.

FIG. 4 shows an exemplary schematic representation of repository 124. The repository may store instructions in many different forms such as a C function, compiled objects, a VHSIC Hardware Description Language (VHDL) process, etc. C functions may be used to identify the sets of stored instructions. Alternatively, processes in a Hardware Description Language (HDL) representation may be used to identify the sets of stored instructions. In other embodiments, procedures, modules, macros, aspects, objects, classes, methods, or any other partitioning mechanism along a given dimension of interest such as structure, partitioned behavior, separated aspect behavior, can be used.

In the exemplary schematic representation of repository 124 in FIG. 4, the instructions for the first model 310 may be stored in repository 124 under the name of 'function counter( )' 410. The instructions may be stored under an automatically configured name that may be based on the user input. Alternatively, the instructions may be stored by a user-selected name.

In addition, information for identifying the call site, i.e., the specific model of which the instructions are a part and where the instructions are employed may be stored with the instructions in repository 124. The call site may be explicitly provided and it may be linked to the model to facilitate the navigation between the stored instructions and the model.

Comments may be included with the stored instructions. The comments may or may not be included in the criteria for checking equivalence, for example, depending on the user needs. Comments may be stored separate from the instructions and be merged when needed. This merge may be temporary or permanent. Inserting the comments in the desired locations may be achieved by storing the information about insertion points with the instructions, the comments, or separately.

If the instructions to be stored are equivalent in some sense, for example, functionally, to previously stored instructions, the instructions may not be added to the repository 124. Instead, the previously stored instructions may be employed by including a reference from the call site, or location where the instructions are used, to the stored instructions. The previously stored instructions may include a new call site as additional information. The instructions can also keep track of the number of times they are referenced by keeping a counter.

The repository 124 may include information for identifying the content of the stored instructions. In an exemplary embodiment, each of the functions or instructions in the repository may be linked to a checksum 420. Each function 410 may be identified by the checksum 420 of the pattern of components. In general, checksums provide an efficient way to give a short numerical value to a large set of items. Checksum algorithms guarantee that for identical collections of items that the checksum generated is the same. Such algorithms also try to produce non-identical checksums for collections of items that differ. Checksums may be used as an efficient way to keep track of the pertinent characteristics associated with a block or group of blocks such as data type, signal dimensions, sample time, etc. Although the preset application is not so limited, one example of a checksum is the MD5 checksum available from RSA Security Inc, of Bedford, Mass. According to an exemplary embodiment, the checksum is calculated on all the properties of each of the patterns that affects the execution structure of the block diagram model. Checksums should give a unique value for each unique set of characteristics. Checksums may be stored using large integers, so that the chance of a false unique value is very small. More than one checksum may be used to identify a unique set of characteristics.

The functions or instructions in the repository may be linked to an intermediate representation (IR) 430 of the functionality. An intermediate representation may be used to recognize a pattern in a model. Either checksum 420 or IR 430 can be used to determine whether a new function needs to be generated or whether given functionality is already captured by a function that is in the repository. In this exemplary embodiment, both an IR and checksum are stored. Only one of the two may be stored and used or an alternate mechanism to verify equivalence may be stored instead. The equivalence may be determined based on some property or set of properties of the functionality. In an exemplary embodiment, many different aspects of the functionality may be employed as the properties. For example, an algorithm may be used as the sole property. In another example, data types, such as sample rates at which the functionality should be executed, may be used as the property. In still another example, other properties, such as memory requirements, stack usage, etc., may be used.

For example, 'function counter( )' 410 may store C code that represents instructions to increment a counter value when invoked. When such counter functionality is part of a model, the C code for the counter functionality may be generated and compared to C code present in the repository. If a match in abstract syntax is found, instead of storing the generated counter C code, a reference to the stored counter C code may be obtained. Likewise, the concrete syntax or abstract semantics may be compared. An intermediate representation, such as a control flow graph, may be compared. A checksum or a binary representation may be compared.

Figure 5A:
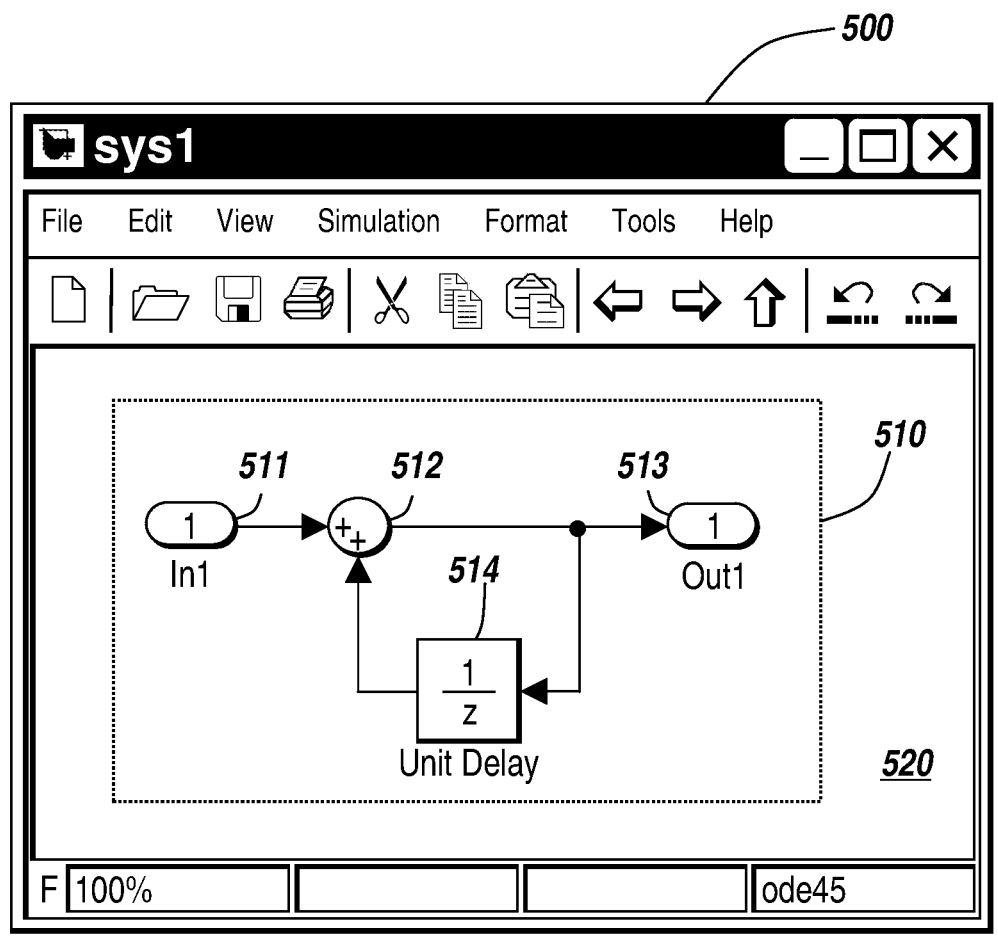
FIG. 5A is an exemplary model that has a subsystem.

FIG. 5A depicts an example that illustrates how a user may designate a model or a portion of the model for storing instructions in a repository. In this example, an exemplary user interface 500 may display the first model 520. A user may select a portion of model 520 to create subsystem 510. A subsystem is an exemplary way for a user to designate a portion of a model for sharing instructions. Different embodiments may be possible depending on the modeling environments where the model 520 is created.

The subsystem 510 may include input port 511 for providing an input value to the sum block 512, and an output port 513 for providing the output of the sum block 512 to the model 520. The subsystem represents one or more components of model 520 with a single graphical entity in model 520. Two types of subsystem blocks may be provided: virtual subsystems and non-virtual subsystems. Virtual subsystems serve the purpose of providing the model with a graphical hierarchy. The components of a virtual subsystem are moved back into the subsystem parent for the model execution. Non-virtual subsystems behave like an elemental dynamic system with its own execution methods (Output, Update, Derivatives, etc.). These execution methods in turn call the execution methods of the subsystem constituents.

Figure 5B:
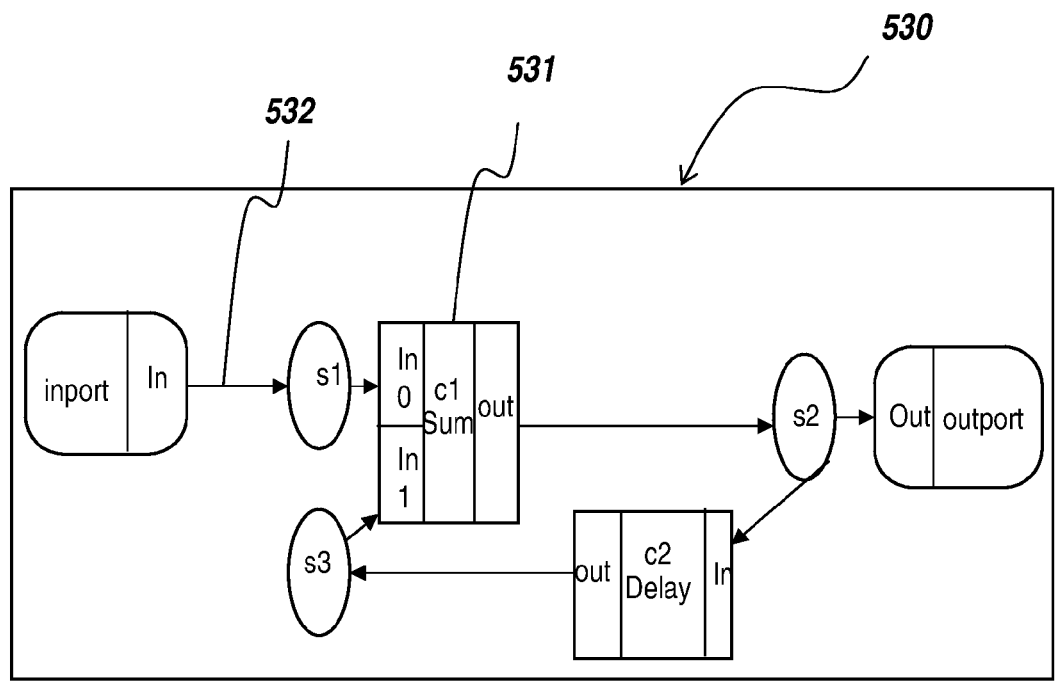
FIG. 5B is an exemplary intermediate representation of a model.

FIG. 5B is an exemplary IR of the model depicted in FIG. 5A. Nodes 531 in the IR 530 may be symbolic representations of activities such as computations to be performed on data, and may correspond to the blocks in the diagram. Edges 532 in the IR 530 (that is, interconnections among graph nodes) may represent input, output, or intermediate data results, utilized or produced by the nodes in the graph, and may represent lines connecting blocks in the original graphical model.

The translation of the source language of the graphical model to the IR 530 can be completed using numerous means. The source language of the graphical model may be analyzed and converted into the IR 530 wherein the IR 530 is in a source and target language independent format. The graphical model data structures may be processed to retrieve records and to generate the IR. This IR may include a hierarchical structure of the records describing systems and their blocks and connections analyzed from a block diagram model.

Figure 6:
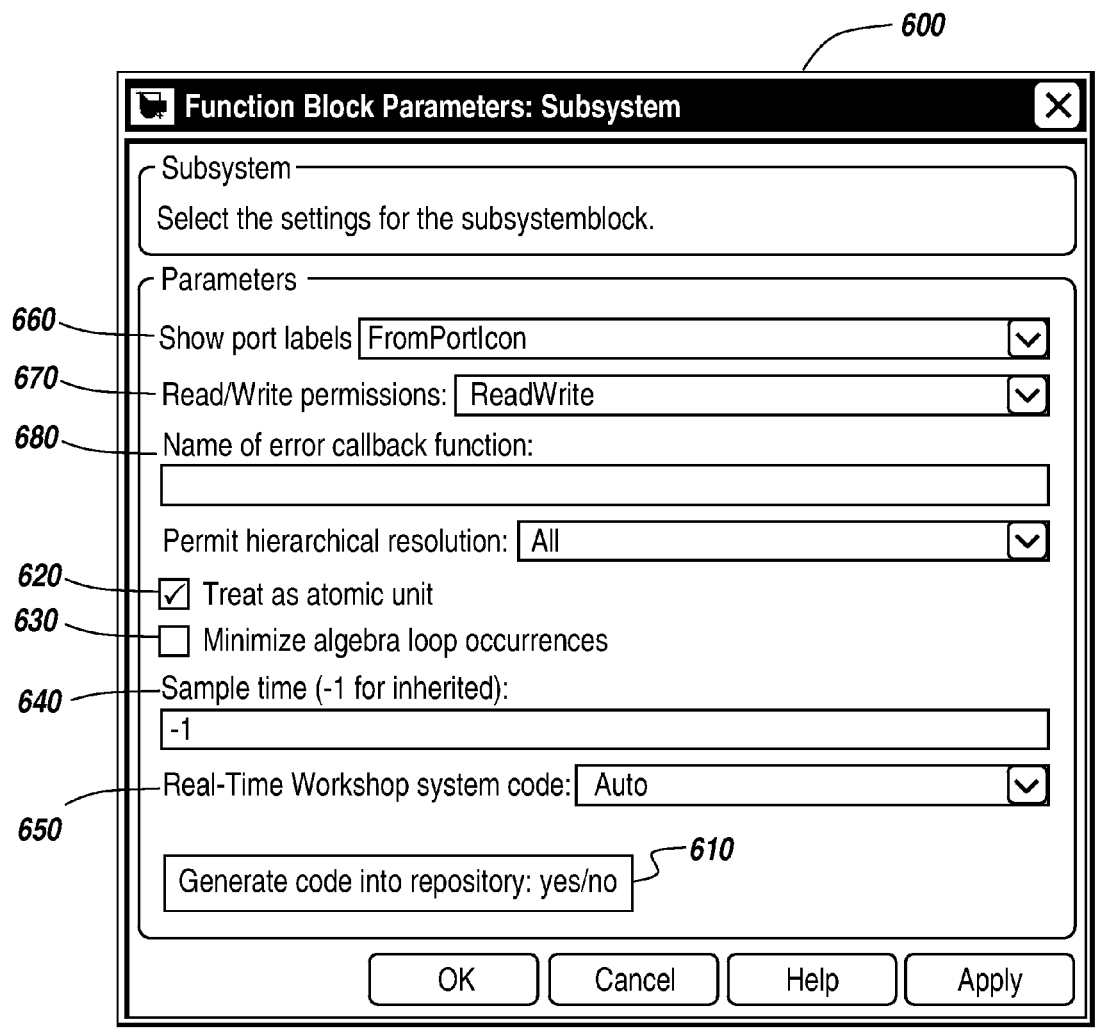
FIG. 6 depicts an exemplary dialog box for the subsystem shown in FIG. 5.

FIG. 6 depicts an exemplary dialog box 600 for a subsystem that enables a user to designate the subsystem for instruction sharing. The subsystem or other modeling elements may have one or more properties. The dialog box 600 may provide a plurality of properties or parameters for a subsystem, including whether the subsystem is treated as one element ('elemental dynamic system') during execution (620), whether the functionality that it contains is processed so that the occurrence of algebraic loops containing the subsystem are minimized (630), what the sample time of a periodic execution of the subsystem is (640), and how code such as C, C++, and HDL representations is generated (650), whether to display labels for the subsystem's ports on the subsystem's icon (660), whether a user can access the contents of the subsystem (670), name of a function to be called if an error occurs while the subsystem is executed (680), and whether to resolve names of workspace variables referenced by this subsystem.

The dialog box 600 may also provide a button 610 or other user interface element to configure the sharing of instructions for evaluation of the subsystem, for example, during simulation or code generation. This is illustrated by the 'Generate code into repository' option that can be set to 'yes' or 'no.' If the instructions for evaluating the subsystem are selected to be stored in a repository 124, the result of processing part or all of the model that includes the subsystem may store the instructions in repository 124.

Conversely, an option may be present as to whether the instructions in a repository may be used for evaluating a given subsystem.

In other embodiments, instructions for a model or a portion of the model may be automatically stored in the repository if a given condition is met. An example of the condition may be the amount of memory required for the instructions. When the instructions for a model or a portion of the model exceed a predetermined level, the instructions for a model or a portion of the model may be stored in the repository automatically.

Figure 7:
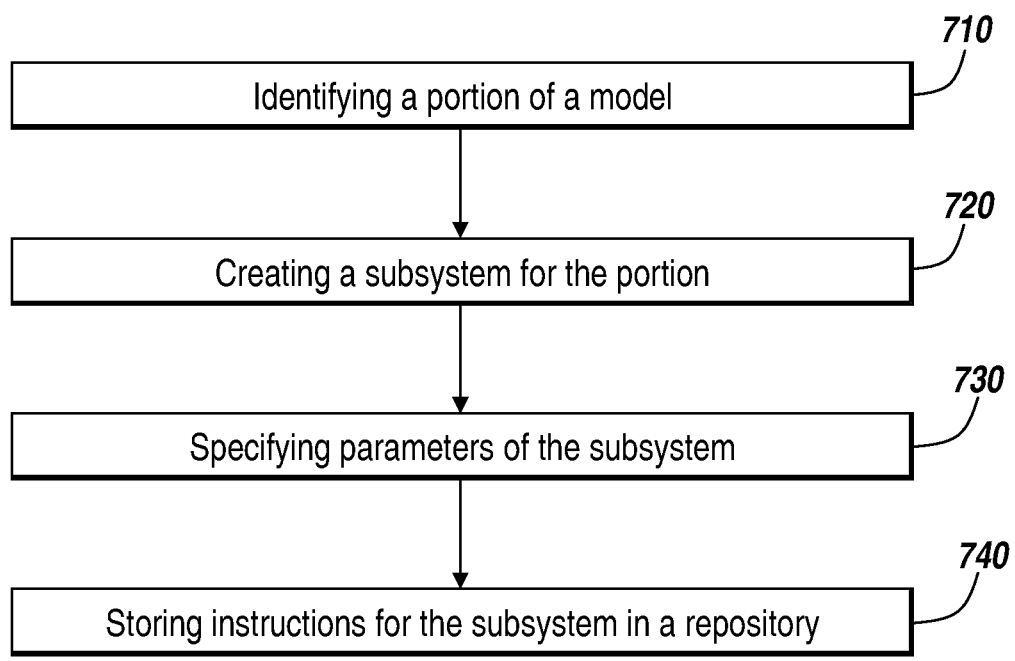
FIG. 7 is a flow chart showing an exemplary procedure for generating instructions for a model and storing the instructions in a repository.

FIG. 7 is a flow diagram that illustrates a procedure for storing instructions for a model of a system into a repository in some exemplary embodiment. A portion of a graphical or text-based model of a system may be identified (step 710). The identified portion of the model may be implemented as a subsystem (step 720). The parameters of the subsystem may be set to configure the sharing of instructions for the subsystem (step 730). Instructions for the subsystem may be generated and stored in the repository (step 740).

Figure 8:
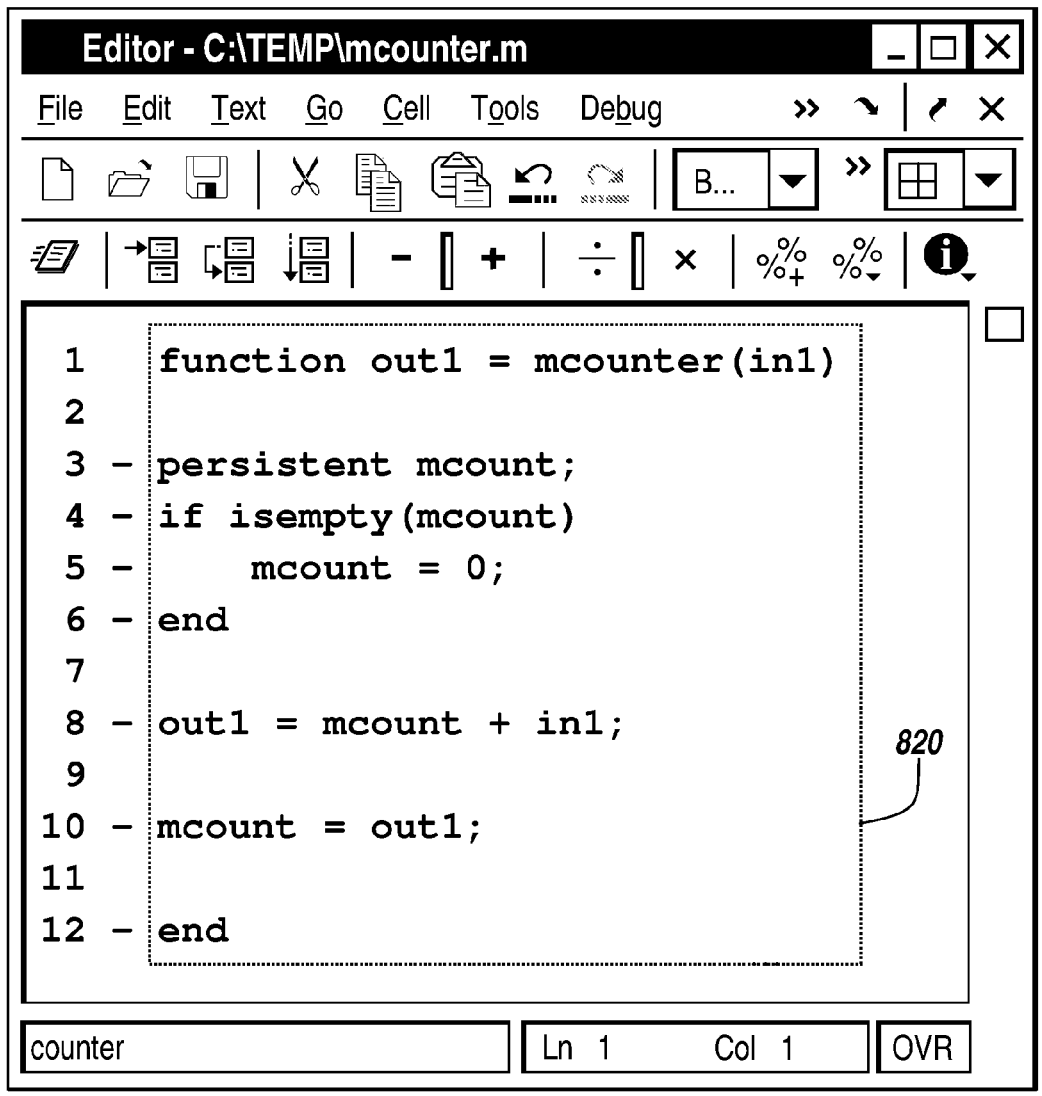
FIG. 8 depicts an exemplary text-based model of a system that includes a function similar to the subsystem depicted in FIG. 5.

As mentioned above, exemplary embodiments may also work with a textual model. FIG. 8 depicts an exemplary text-based model that includes a function that is equivalent to instructions stored in the repository. In this example, a MATLAB m function includes a counter function 820. The function 'encounter' takes as input a variable 'in1' and uses this to increment the value of a persistent variable 'mcount' that is initialized to 0. The value of 'mcount' is provided as output by the variable 'out1'. This functionality is equivalent to that of the subsystem 510 (FIG. 5A) where the sample time of Unit Delay may be considered inherited and can be set by the caller of the function. This equivalence may be reflected in an equivalent checksum that is computed for both the subsystem and the function. Alternatively, the equivalence can be established by comparing an intermediate representation of both the subsystem and the function, for example as a control flow graph or data flow graph. These intermediate representations may be equivalent with respect to the functionality they capture. This feature may provide the advantage of being able to potentially inline the code where it is used if that proves to be more efficient.

Figure 9:
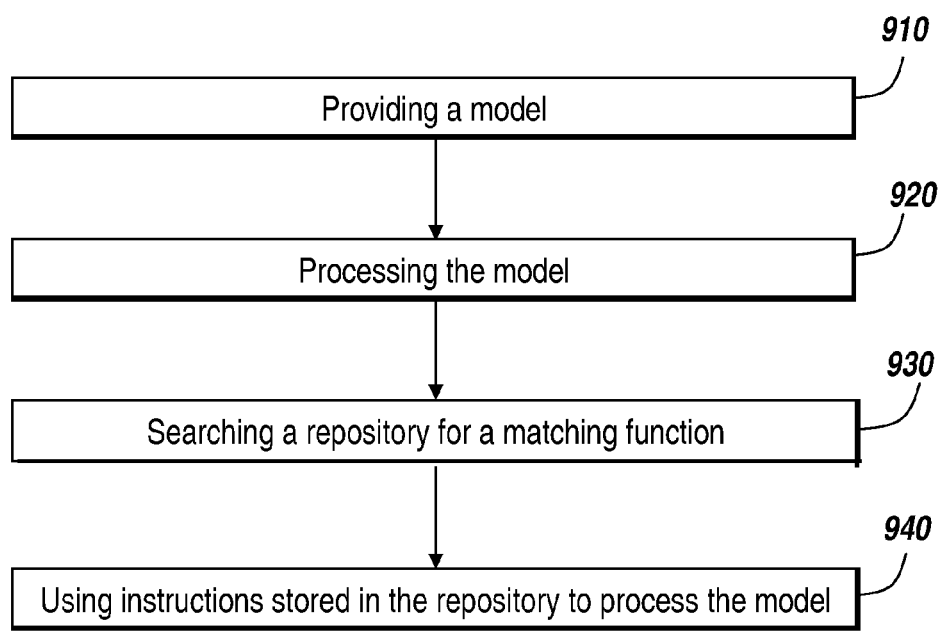
FIG. 9 is a flow chart showing an exemplary procedure for sharing instructions stored in a repository.

FIG. 9 is a flow diagram that illustrates the steps that may be performed in developing a model using shared instructions. A model may be provided in the modeling environment (step 910). A user may build a new model using component libraries provided in the modeling environment. A user may load an existing model that is stored in a storage device. The model may be processed to simulate the system represented by the model or to generate instructions for the model (step 920). The model may be compiled and linked to execute the model over the desired time-span. A repository may be checked to determine whether an equivalent function is stored in the repository (step 930). If an equivalent function is stored in the repository, instructions for the equivalent function stored in the repository may be used for processing the model or a portion of the model (step 940).

In an exemplary embodiment, the equivalent function stored in the repository may be used for executing the model or a portion of the model. In other embodiments, the equivalent function stored in the repository may be used for static analysis that determines dynamic properties of a model using abstract semantics. The abstract semantics is an abstraction of formal semantics of a programming language so that the abstract semantics covers all related semantics. Such static analysis may rely on an intermediate representation and also use equivalent fragments of the representation between models.

When an intermediate representation is used, the intermediate representation may be processed to arrive at a canonical form. A canonical form refers to a standard representation. A canonical form may be given in such a manner that the representations in a class is equivalent to one representation in canonical form. The canonical form represents an equivalence class. For example, computations may be reordered to establish function equivalence between two intermediate representations. For example, functionality that multiplies a variable with a constant factor and then is delayed by one evaluation may be considered equivalent to first delaying the variable by one evaluation and then multiplying the delayed value with the constant factor. Similarly, mathematical representations may be derived such as a controller or observer canonical form.

Figure 10:
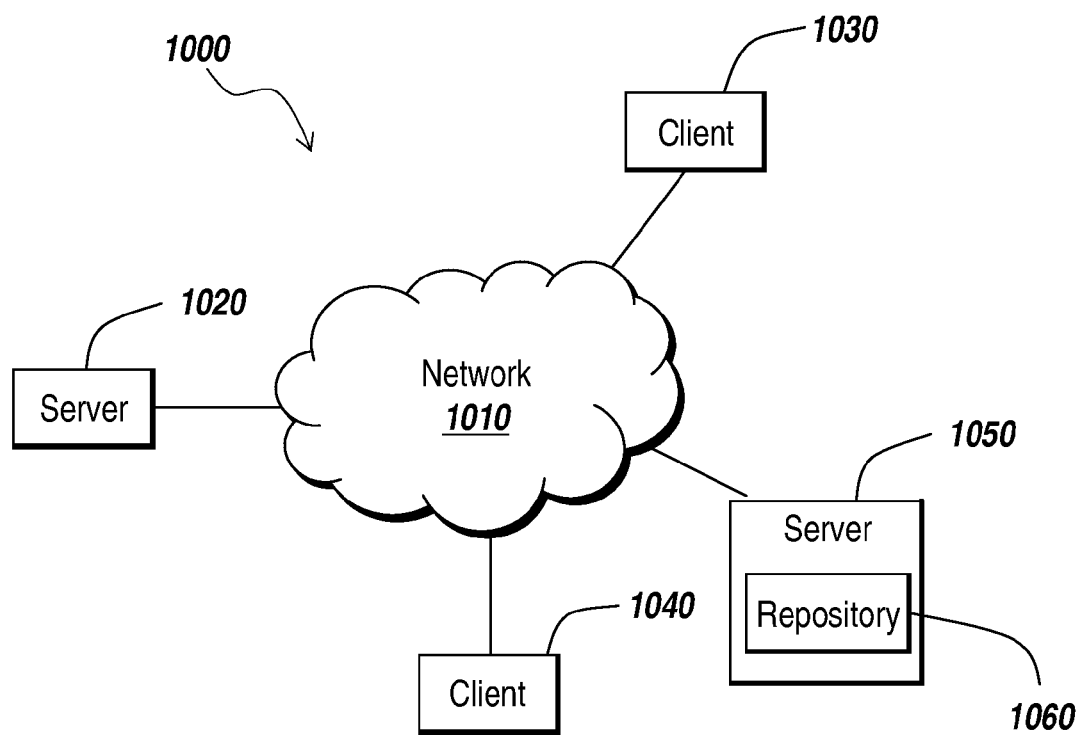
FIG. 10 depicts an exemplary environment for practicing an exemplary embodiment in a distributed manner.

FIG. 10 illustrates an exemplary network environment 1000 suitable for processing distributed implementations of the exemplary embodiments. Environment 1000 may include one or more servers 1020 and 1050 coupled to clients 1030 and 1040 via a communication network 1010. Repository 1060 may be provided in server 1050. Communication network 1010 may include Internet, intranet, Local Area Network (LAN), Wide Area Network (WAN), Metropolitan Area Network (MAN), wireless network (e.g., using IEEE 802.11, Bluetooth, etc.), etc. Communication network 1010 may use middleware, such as Common Object Request Broker Architecture (CORBA) or Distributed Component Object Model (DCOM) to allow a computer (e.g., client 1020) on communication network 1010 to communicate directly with another computer or device (e.g., client 1030) that is connected to communication network 1010. In addition, communication network 1010 may use Remote Method Invocation (RMI) or Remote Procedure Call (RPC) technology. RMI and RPI are exemplary technologies that allow functions, methods, procedures, etc., to be called over environment 1000. For example, client 1030 may invoke a method that resides remotely on client 1040.

Models may run on clients 1030 and 1040. Client 1030 or 1040 may access server 1050 to store instructions in repository 1060 or retrieve instructions from repository 1060. In another embodiment, the repository may be distributed over the network. The models may access the information as to where the information in repository 1060 is available. For example, when a central database or directory on a file server is employed, the models may need to have the information where this database or directory is located. In other examples, the information where the central database is located may be kept separate from the models. For example, this information may be kept by the modeling application. When the stored instructions are used, additional functionality may be required to ensure that correct data is available in the globally accessible storage. For example, when a static variable in C is used by a function, the caller of this function has to properly initialize the memory that is shared by the function. This requires the caller to contain the information about the memory location that is being shared. Such information may be retrieved by analyzing the stored function, or it may be precompiled and linked to the function as additional information.

Exemplary embodiments may be provided as one or more computer-readable programs embodied on or in one or more storage mediums. The mediums may be, but are not limited to a hard disk, a compact disc, a digital versatile disc, a flash memory card, a Programmable Read Only Memory (PROM), a Random Access Memory (RAM), a Read Only Memory (ROM), Magnetoresistive Random Access Memory (MRAM), a magnetic tape, or the genome in a cell nucleus. In general, the computer-readable programs may be implemented in any programming language. Some examples of languages that may be used include Python, C, C++, C#, Java, Javascript etc. Further, the computer readable programs may be implemented in a hardware description language or any other language that allows prescribing computation such as, for example, Deoxyribonucleic acid (DNA). The software programs may be stored on or in one or more storage mediums as object code.

Exemplary embodiments are described above. It is, however, expressly noted that these exemplary embodiments are not limiting, but rather the intention is that additions and modifications to what is expressly described herein also are included within the scope of the present implementation. Moreover, it is to be understood that the features of the various embodiments described herein are not mutually exclusive and can exist in various combinations and permutations, even if such combinations or permutations are not made express herein, without departing from the spirit and scope of the present implementation.

Since certain changes may be made without departing from the scope of the present implementation, it is intended that all matter contained in the above description or shown in the accompanying drawings be interpreted as illustrative and not in a literal sense. Practitioners of the art will realize that the sequence of steps and architectures depicted in the figures may be altered without departing from the scope of the present implementation and that the illustrations contained herein are singular examples of a multitude of possible depictions of the present implementation.

What is claimed is:

1. A non-transitory computer-readable storage medium for storing instructions that, when executed on a computing device, cause the computing device to:
   identify a portion of a first stand-alone model in a graphical modeling environment;
   process the portion of the first stand-alone model to produce first instructions for the portion of the first stand-alone model, the first instructions are used for executing the portion of the first stand-alone model;
   hold the first instructions in a repository;
   compare the portion of the first stand-alone model with a portion of a second stand-alone model;
   determine, based on the comparing, that the portion of the first stand-alone model and the portion of the second stand-alone model are equivalent; and
   produce second instructions for the portion of the second stand-alone model, where:
     the second instructions are used for executing the portion of the second stand-alone model,
     the producing includes:
       reusing the first instructions as the second instructions based on the determining.

2. The medium of claim 1, further storing instructions that, when executed on the computing device, cause the computing device to:
   provide an option, the option indicating whether the first instructions in the repository are able to be used for evaluating the second stand-alone model.

3. The medium of claim 1, wherein the first stand-alone model or the second stand-alone model is represented in memory using a stand-alone executable data structure.

4. The medium of claim 1, wherein the first stand-alone model or the second stand-alone model, when executed, perform one or more simulation loops to solve equations that represent components of the first stand-alone model or the second stand-alone model.

5. The medium of claim 1, further storing instructions that, when executed on the computing device, cause the computing device to:
share the first instructions across graphical and textual models.

6. The medium of claim 1, wherein the first instructions comprise at least one of an intermediate representation or an in-memory representation.

7. The medium of claim 6, wherein the intermediate representation is in a canonical form and is used for simulation, code generation, or static analysis.

8. The medium of claim 1, wherein the portion of the first stand-alone model and the portion of the second stand-alone model are equivalent if common properties are embodied by the portion of the first stand-alone model and the portion of the second stand-alone model.

9. The medium of claim 1, further storing instructions that, when executed on the computing device, cause the computing device to:
store the first instructions automatically in the repository if a given condition is met.

10. The medium of claim 1, wherein:
a simulation or execution of the first stand-alone model determines a behavior of the first stand-alone model, and
a simulation or execution of the second stand-alone model determines a behavior of the second stand-alone model.

11. A method comprising:
identifying, using a computing device, a portion of a first stand-alone model in a graphical modeling environment;
processing, using the computing device, the portion of the first stand-alone model to produce first instructions for the portion of the first stand-alone model, the first instructions are used for executing the portion of the first stand-alone model;
holding the first instructions in a repository;
comparing, using the computing device, the portion of the first stand-alone model with a portion of a second stand-alone model;
determining, using the computing device and based on the comparing, that the portion of the first stand-alone model and the portion of the second stand-alone model are equivalent; and
producing, using the computing device, second instructions for the portion of the second stand-alone model, where:
the second instructions are used for executing the portion of the second stand-alone model,
the producing includes:
reusing the first instructions as the second instructions based on the determining.

12. The method of claim 11, further comprising:
providing an option, the option indicating whether the first instructions in the repository are able to be used for evaluating the second stand-alone model.

13. The method of claim 11, wherein the first stand-alone model or the second stand-alone model is represented in memory using a stand-alone executable data structure.

14. The method of claim 11, wherein the first stand-alone model or the second stand-alone model, when executed, perform one or more simulation loops to solve equations that represent components of the first stand-alone model or the second stand-alone model.

15. The method of claim 11, further comprising:
sharing the first instructions across graphical and textual models.

16. The method of claim 11, wherein the first instructions comprise at least one of an intermediate representation or an in-memory representation.

17. The method of claim 11, wherein the intermediate representation is in a canonical form and is used for simulation, code generation, or static analysis.

18. The method of claim 11, wherein the portion of the first stand-alone model and the portion of the second stand-alone model are equivalent if common properties are embodied by the portion of the first stand-alone model and the portion of the second stand-alone model.

19. The method of claim 11, further storing instructions that, when executed on the computing device, cause the computing device to:
store the first instructions automatically in the repository if a given condition is met.

20. A system comprising:
a processor executing instructions for:
identifying, using a computing device, a portion of a first stand-alone model in a graphical modeling environment;
processing, using the computing device, the portion of the first stand-alone model to produce first instructions for the portion of the first stand-alone model, the first instructions are used for executing the portion of the first stand-alone model;
comparing, using the computing device, the portion of the first stand-alone model with a portion of a second stand-alone model;
determining, using the computing device and based on the comparing, that the portion of the first stand-alone model and the portion of the second stand-alone model are equivalent; and
producing, using the computing device, second instructions for the portion of the second stand-alone model, where:
the second instructions are used for executing the portion of the second stand-alone model,
the producing includes:
reusing the first instructions as the second instructions based on the determining; and
a storage device for holding the first instructions.

* * * * *